United States Patent [19]

Yamashita

[11] Patent Number: 4,642,510
[45] Date of Patent: Feb. 10, 1987

[54] MOUNT FOR QUARTZ CRYSTAL OSCILLATOR DEVICE

[75] Inventor: Yukio Yamashita, Shiga, Japan

[73] Assignee: Kyocera Corporation, Kyoto, Japan

[21] Appl. No.: 825,686

[22] Filed: Jan. 31, 1986

Related U.S. Application Data

[63] Continuation of Ser. No. 719,373, Apr. 3, 1985, abandoned.

[30] Foreign Application Priority Data

Apr. 27, 1984 [JP] Japan .............................. 59-63118[U]

[51] Int. Cl.4 ............................................ H01L 41/08
[52] U.S. Cl. .................................... 310/348; 310/344; 310/351
[58] Field of Search ................. 310/344, 348, 351-353

[56] References Cited

U.S. PATENT DOCUMENTS

| | | | |
|---|---|---|---|
| 2,247,627 | 7/1941 | Atwood et al. | 310/352 X |
| 2,771,561 | 11/1956 | Fuller | 310/348 X |
| 3,518,470 | 6/1970 | Lungo | 310/352 |
| 3,612,922 | 10/1981 | Furnival | 310/351 |

Primary Examiner—Mark O. Budd
Attorney, Agent, or Firm—Spensley Horn Jubas & Lubitz

[57] ABSTRACT

A quartz crystal oscillator device including a quartz crystal resonator supported on a base via a support member and hermetically sealed by a cap wherein the support member comprising a pair of upper and lower disc-shaped connection sections, a through section which is provided between the two connection sections, and bent legs. This quartz crystal oscillator device has high resistance against impact and thermal shock and its resonance frequency is not affected by sealing stress. Furthermore, it can be assembled efficiently and made small.

12 Claims, 9 Drawing Figures

MOUNT FOR QUARTZ CRYSTAL OSCILLATOR DEVICE

This is a continuation of copending application Ser. No. 719,373 filed Apr. 3, 1985, now abandoned.

BACKGROUND OF THE INVENTION

1. Field of the Invention

The present invention relates to a quartz crystal oscillator device in which a quartz crystal resonator is hermetically sealed in a metallic container, and more particularly to a small quartz crystal oscillator device which is superior in shock resistance and whose resonance frequency is not affected by sealing stress.

2. Prior Art

A conventional support construction of a quartz crystal resonator which is hermetically sealed in a metallic container is shown in FIG. 1. With this construction, a quartz crystal resonator 14 is installed and supported on rigid pins 13, 13 which are electrically connected to external leads 12 of a metallic base 11.

When the quartz crystal resonator 14 is hermetically sealed by cold-welding a metallic cap 15 on the base 11 on which the quartz crystal resonator 14 is supported, however, a distortion stress is caused at the base 11 if the base 11 and the cap 15 are not flat, because the welding mold of a welding machine pushes the flange sections 111 of the base 11 and the cap 15. As a result, the stress is applied to the quartz crystal resonator 14 via a substrate 16 and the pins 13, 13, and the resonance frequency of the quartz crystal resonator is greatly reduced. In addition, when a thin quartz crystal resonator is used to meet the needs for miniaturization of the quartz crystal resonator 14, a strain is caused between the metallic base 11 and the substrate 16 made of ceramics for example due to the difference between the thermal expansion coefficients of the two materials. Thus, a bending stress is applied to the quartz crystal resonator and the temperature and thermal shock characteristics of the quartz crystal resonator are adversely affected. To solve these problems, a method of using coil springs (see FIG. 2) instead of using the rigid pins has been proposed so that the coil springs function to support the quartz crystal resonator and to release the stress applied to the quartz crystal resonator (Japanese Patent Provisional Publication No. 59-5715).

According to FIG. 2, a quartz crystal resonator 23 is installed at the opening of a second coil spring 223 of a support member 22 using conductive adhesive and hermetically sealed by a metallic cap 24 to form a quartz crystal oscillator device 21.

The support member 22 is composed of a first coil spring 221 which is wound on an inner lead 25 connected to an external lead 26, a horizontal section 222 which horizontally extends from the first coil spring 221 and the second coil spring 223 which rises from the end of the horizontal section. This construction is effective in elastically absorbing the above-mentioned sealing stress or external shocks applied to the quartz crystal resonator using the coil springs 221 and 223 and the horizontal section 222. However, the support member 22 is elastic and springy since it includes the coil springs 221 and 223 and the horizontal section 222. Thus, when many support members 22 are selectedly fed by a parts feeder in an assembly process, they are easily tangled with one another at their coil springs 221 and 223, stopping smooth feeding at the parts feeder.

Furthermore, when the support members are mounted by a chip mounting machine, they may not be separated individualy because they are tangled with one another. Thus, the mounting machine is likely to mount two pieces of the support members at the same time or does not properly pick up the support members by suction, thereby preventing proper mounting. Therefore, the support member is not suited for automatic mounting and thus its assembly cost is rather high.

SUMMARY OF THE INVENTION

It is therefore an object of the present invention to provide a small quartz crystal oscillator device which is free from the above-mentioned problems found in the two prior arts, less affected by the sealing and thermal stresses, and superior in assembly efficiency.

This object of the present invention is achieved by the support member comprising a pair of upper and lower disc-shaped connection sections, a vertical through section which is provided between a circumferential portion of one connection section and that of the other connection section to integrally connect the two connection sections, and plural bent legs vertically projected from circumferential portions of the connection sections other than the circumferential portion for the through section, with their distal ends left free.

The object will become more apparent when preferred embodiments of the present invention are considered in connection with the drawings.

DETAILED DESCRIPTION OF THE PREFERRED EMBODIMENTS

Figure 1:
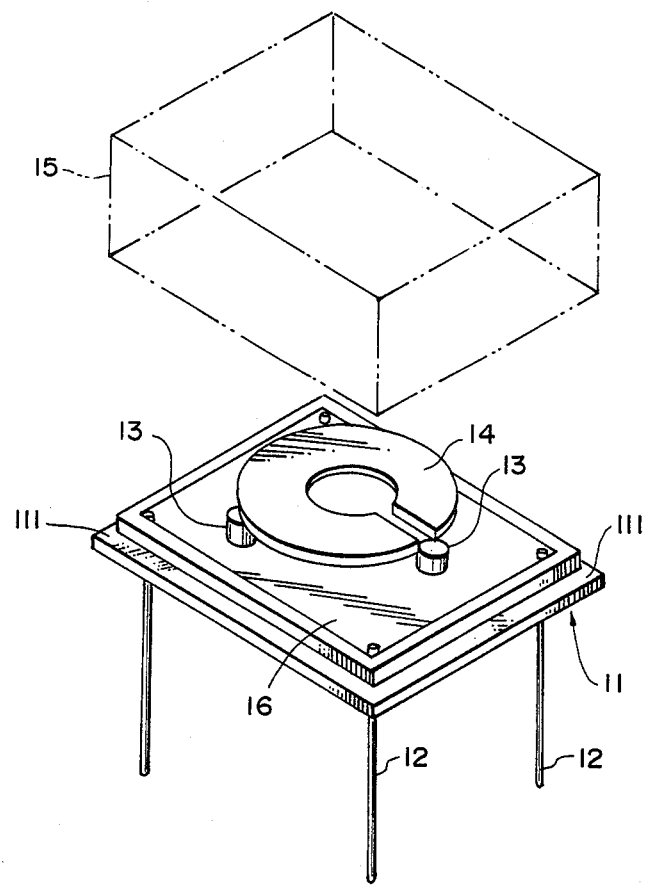
FIG. 1 is a perspective view of a conventional quartz crystal oscillator device.
Figure 2:
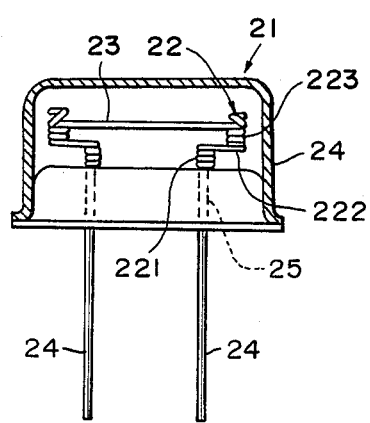
FIG. 2 is a vertical sectional front view of the conventional quartz crystal oscillator device.
Figure 3A:
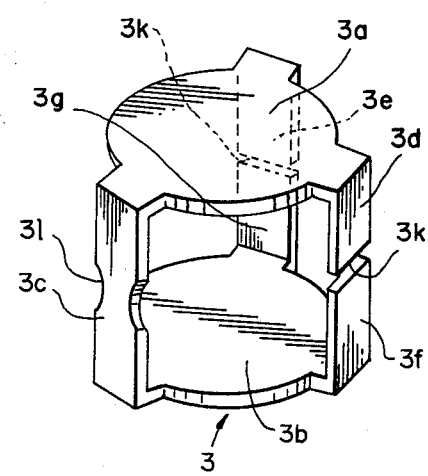
FIGS. 3 (a)–(c) are a perspective view, a plan view and a front view of an embodiment of the support member of the present,, invention respectively.
Figure 3B:
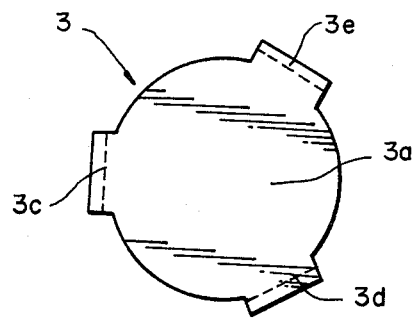
Figure 3C:
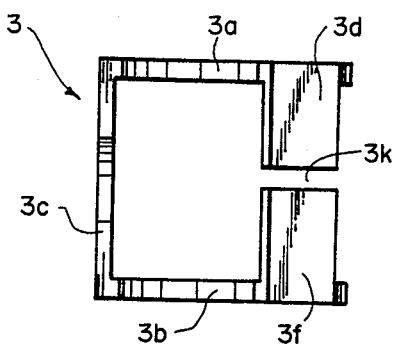
Figure 5:
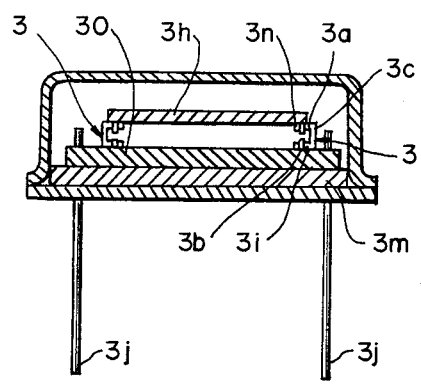
FIG. 5 is a partly sectional front view of the quartz crystal oscillator device of the present invention composed of the support member illustrated in FIG. 3.

FIG. 3 shows an embodiment of the support member 3 of the present invention. The support member 3 is an integrated part made of phosphor bronze or other conductive materials. As clearly shown in FIG. 3 (a), the embodiment of the support member 3 has a pair of upper and lower disc-shaped connection sections 3a and 3b. As shown in FIG. 5, the connection section 3a is electrically connected to the lead (not shown) of a quartz crystal resonator 3k by a connecting means 3n, such as soldering. The other connection section 3b is connected to the conductive section 3i of the thick film substrate 30 provided on the base 3m which is connected to an external lead 3j. A through section 3c is provided between a circumferential portion of the connection section 3a and that of the connection section 3b to integrally connect the connection sections 3a and 3b. In addition, two pairs of bent legs 3d and 3f, and 3e and 3g are vertically projected (bent almost 90 degrees) from circumferential portions of the connection sections, 120 degrees apart from each other along the circumference of the connection sections 3a and 3b, so that the distal ends of each pair of the legs are left free and face each other. The through section 3c is disposed 120 degrees apart from each pair of the bent legs along the circumferences of the connection sections 3a and 3b. A gap 3k is provided between the bent legs 3d and 3f, and 3e and 3g so that the facing distal ends of the bent legs are left free and do not contact each other. As shown in FIG. 3 (b), the through section 3c and the bent legs 3d-3g are externally projected (in the radial direction) from the circumferential portions of the connection sections 3a and 3b, i. e., are provided along the circumferences of a circle having a slightly larger diameter than the diameter of the connection section 3a. A narrow section 3l is provided in the middle of the through section 3c as shown in FIG. 3 (a) so that the through section 3c can elastically connect and hold the connection sections 3a and 3b. If the through section 3c per se is narrow enough to have proper elasticity, the narrow section 3l can be omitted.

Figure 4A:
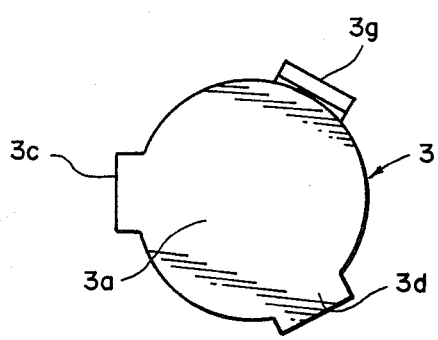
FIGS. 4 (a)–4 (c) are a plan view, a front view and a perspective view of another embodiment of the support member of the present invention respectively.
Figure 4B:
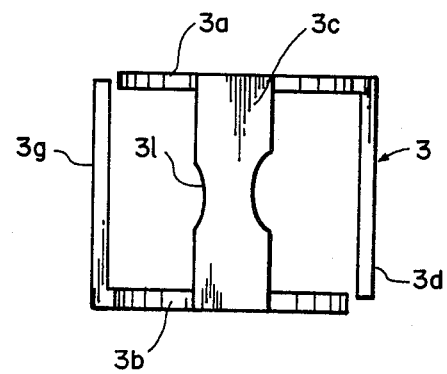
Figure 4C:
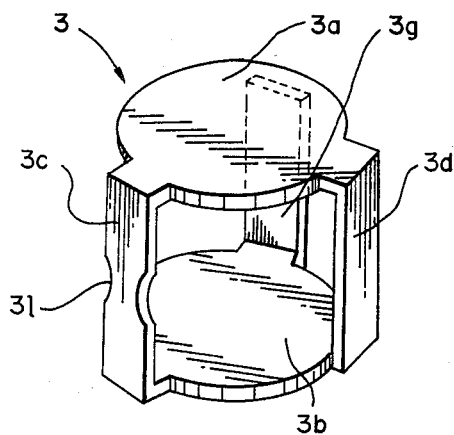

Another embodiment of the support member 3 of the present invention is shown in FIGS. 4 (a), 4 (b) and 4 (c). The construction of the bent legs of this embodiment differs from that of the bent legs 3d-3g of the first embodiment. Unlike the first embodiment in which two pairs of the bent legs are projected from the circumferential portions of the upper and lower connection sections 3a and 3b, and the distal ends of each pair of the bent legs face each other, one bent leg is projected from a circumferential portion of the connection section 3a and the other bent leg is projected from a circumferential portion of the connection section 3b. More specifically, the bent leg 3d is projected from a circumferential portion of the connection section 3a and the bent leg 3g is projected from a circumferential portion of the connection section 3b as shown in FIGS. 4 (a) through (c). In these two embodiments, the through section 3c functions as a means for elastically connecting and supporting the upper and lower connection sections 3a and 3b. The bent legs 3d-3g function to absorb vibration applied to the connection sections 3a and 3b. Furthermore, when the connection sections 3a and 3b are vertically pressed, the facing distal free ends of the bent legs contact each other or contact the substrate 30 to prevent the connection sections 3a and 3b from being deformed further. The gap 3k between the distal ends of the bent legs 3d and 3f, and 3e and 3g is slightly smaller than the thickness of the connection sections 3a and 3b as shown in FIG. 3 (c) to prevent the support members 3 from being tangled with one another when they are fed by a parts feeder.

FIG. 5 shows a quartz crystal oscillator device composed of the support member 3 of the present invention having the construction described above. Although the connection section 3a is placed upper in FIG. 5, it is obvious that the connection section 3b can be placed upper by turning the support member 3 upside down. According to the construction shown in FIG. 5, the through section 3c functions as a means for elastically connecting and supporting the upper and lower connection sections 3a and 3b and elastically copes with thermal and sealing stresses and vibration applied to the base 3m in order to prevent the quartz crystal resonator 3h from being vibrated. The bent legs 3d-3f also function to absorb the vibration. With these functions, the resonance frequency of the quartz crystal resonator 3h is far less affected by the stresses and vibration, and the quartz crystal oscillator device having the above-mentioned construction can have higher resistance against impact and thermal shock. Moreover, since the through section 3c and the bent legs 3d-3g are provided along the circumferential portions (externally projected from the circumferential portions) of the connection sections 3a and 3b, tangling of the support members is greatly reduced when they are mounted by a chip mounting machine. This greatly helps improve the assembly efficiency of the quartz crystal oscillator device. The present invention is able to provide these superior advantages.

It is further understood by those skilled in the art that the foregoing descriptions are two preferred embodiments of the disclosed quartz crystal oscillator device and that various changes and modifications may be made in the invention without departing from the spirit and scope thereof.

I claim:

1. A quartz crystal oscillator device including a quartz crystal resonator supported on a base via a support member and hermetically sealed by a cap mounted on said base, said support member being characterized in that it comprises a pair of upper and lower planar connection sections, a vertical through section which is provided between a peripheral portion of one connection section and that of the other connection section for integrally connecting said connection sections, and plural pairs of bent legs vertically projected from peripheral portions of said connection sections other than said peripheral portion for the through section, with their distal ends left free.

2. A quartz crystal oscillator device as defined in claim 1, wherein pairs of said bent legs are vertically projected from said peripheral portions of said connection sections so that the ends of each pair of said bent legs face each other, with a gap therebetween so as not to contact each other.

3. A quartz crystal oscillator device as defined in claim 2, wherein said connection sections are planar, said through section is solely provided between a peripheral portion of one connection section and that of the other connection section, two pairs of said bent legs are projected from said peripheral portions of said connection section other than said peripheral portion for said through section, 120 degrees apart from each pair of said bent legs and from said through section along the periphery of said connection sections.

4. A quartz crystal oscillator device as defined in claim 2 wherein said gap between each pair of said bent legs is smaller than the thickness of said connection sections.

5. A quartz crystal oscillator device including a quartz crystal resonator supported on a base via a support member and hermetically sealed by a cap mounted on said base, said support member being characterized in that it comprises a pair of upper and lower planar connection sections, a vertical through section which is provided between a peripheral portion of one connection section and that of the other connection section for integrally connecting said connection sections, and at least two bent legs vertically projecting from staggered peripheral portions of the upper and lower connection sections, other than said peripheral portion for the through section, such that no leg projecting from the upper connection section opposes a leg on a directly opposite peripheral portion of the lower connection section, and wherein the distal ends of each projecting leg are left free.

6. A quartz crystal oscillator device as defined in claim 5 wherein said two bent legs are disposed 120 degrees apart from each other and from said through section along the periphery of said connection sections.

7. A quartz crystal oscillator device as in claim 1, wherein said connection sections are disc-shaped.

8. A crystal resonator support device, comprising:
a first member for attachment to a foundation;
a second member for supporting a crystal resonator;
a connecting member, one end of said connecting member being attached to the periphery of said first member, the opposite end of said connecting member being attached to the periphery of said second member; and
at least one leg, each leg projecting from the periphery of one of said first and second members toward the other member.

9. A crystal resonator support as in claim 8, wherein said first and second members are planar, said first member being approximately parallel to said second member.

10. A crystal resonator support as in claim 9, wherein said legs project perpendicularly from said first and second planar members.

11. A crystal resonator support as in claim 10, wherein said first and second planar members are disc-shaped.

12. A crystal resonator support as in claim 11, wherein there are a plurality of legs, each disposed 120 degrees from said connecting member along the circumference of said disc-shaped planar members.

* * * * *